United States Patent [19]
Ruell

[11] 4,135,251
[45] Jan. 16, 1979

[54] METHOD FOR CODED SEQUENTIAL NON-COHERENT, REDUNDANT OPTICAL DATA-STORAGE

[75] Inventor: Hartwig Ruell, Munich, Germany

[73] Assignee: Siemens Aktiengesellschaft, Berlin & Munich, Fed. Rep. of Germany

[21] Appl. No.: 342,301

[22] Filed: Mar. 12, 1973

[30] Foreign Application Priority Data

Mar. 24, 1972 [DE] Fed. Rep. of Germany ....... 2214396

[51] Int. Cl.² .......................... G02B 5/32; G03H 1/18; G03H 1/10; G03H 1/26
[52] U.S. Cl. .................................. 365/216; 365/125; 350/3.79; 350/3.61
[58] Field of Search .......................... 179/1.5 M, 1.5 C; 350/3.5; 346/33 A; 365/216, 125

[56] References Cited

U.S. PATENT DOCUMENTS 3,764,979  10/1973  Gabor ................................... 350/3.5
3,778,128  12/1973  Nannan ................................. 350/3.5

Primary Examiner—Nelson Moskowitz
Attorney, Agent, or Firm—Hill, Gross, Simpson, Van Santen, Steadman, Chiara & Simpson

[57] ABSTRACT

A method for coded, sequential, non-coherent, redundant, optical data storage wherein a number of one-dimensional holograms is recorded in a timed succession upon a light-sensitive tape through the utilization of a pulse amplitude-modulated light beam and a correction light beam of the light-sensitive tape is separately effected from the signal beam with respect to space and time in such a way that the entire exposure resulting from the signal exposure beam and the correction exposure beam is constant during each recordation, and wherein either the pulse amplitude- modulated light beam or the correction exposure beam are modulated with a noise intensity with respect to time in such a way that the contrast of the individual recorded holograms varies statistically.

5 Claims, 4 Drawing Figures

METHOD FOR CODED SEQUENTIAL NON-COHERENT, REDUNDANT OPTICAL DATA-STORAGE

BACKGROUND OF THE INVENTION

1. Field of the Invention

This invention relates to a method for coded, sequential, noncoherent, redundant, optical data storage wherein a number of one-dimensional holograms are reproduced upon a light-sensitive tape in a timed sequence with the help of a pulse amplitude-modulated light beam, and a correction exposure of the light-sensitive tape, which is separate from the signal effected exposure with respect to space and time is effected in such a way that the entire exposure resulting from the signal exposure and the correction exposure is constant during each recordation, and more particularly to a method of the above type wherein one of the beams is noise intensity modulated with respect to time to provide a contrast of the individual holograms which statistically varies.

2. Description of the Prior Art

In sequential optical data storage, the process was heretofore such that a time variable signal was modulated upon a laser beam by means of pulse amplitude-modulation, and this intensity modulated laser beam was caused to interfere with a coherent timely constant reference wave upon a light-sensitive storage medium. The resulting interference figure is then recorded as a one-dimensional hologram upon a moving storage tape. Each sensing pulse is associated with a hologram whose contrast is a measure of the level of the corresponding pulse.

In a case such as set forth above, each sensing pulse will produce a new hologram. Therefore, the mechanical stability conditions which are common in holography must be maintained by the recording system during the recording interval. For this reason, and due to their coherent properties, only lasers could be considered as practical light sources.

In order to avoid these drawbacks, it has been suggested for sequential, non-coherent, redundant, optical data storage to arrange a one-dimensional hologram ahead of the light-sensitive band, which hologram is recorded upon the light-sensitive band by a pulse amplitude-modulated, non-coherent light beam. In order to further prevent a movement of the operational point in the individual exposures along the characteristic of the recording medium, it was also suggested to provide a correction exposure of the light-sensitive band, the correction exposure to be separate from the signal exposure with respect to space and time in such a way that the entire exposure resulting from the signal exposure and the correction exposure is constant during each recording operation. In this connection, one may refer to German patent application No. P 21 48 649.7-53 or to the corresponding U.S. patent application Ser. No. 290,796, filed Sept. 21, 1972.

SUMMARY OF THE INVENTION

In accordance with new techniques, it is often desired, due to reasons of secrecy, to record information not only quickly, non-coherently and redundantly, but in addition recording is to be done in coded form.

It is therefore the object of the present invention to provide a method for coded optical data storage wherein a reconstruction of the coded stored data, without knowledge of the key applied for coding, is not possible.

Proceeding from a method of the initially mentioned kind, the foregoing object is achieved, according to the present invention, by providing that either the pulse amplitude-modulated light beam or the correction exposure beam are timely modulated with a noise intensity signal in such a way that the contrast of the individual recorded holograms statistically varies.

The spectrum of the noise signal is thereby to be dimensioned in such a way that the resulting entire exposures are positioned within the linear range of the characteristic of the light-sensitive tape.

Preferably, the noise signal is simultaneously recorded upon a second light-sensitive tape.

It is particularly advantageous when synchronization marks are recorded upon both light-sensitive tapes at equal instance of time.

Also, it is preferable that both the tape with the coded stored data and the tape with the stored noise signal be permeated by a respective construction light beam, whereby these light beams are intensity modulated corresponding to the local transparency structure of the tapes, and each light beam strikes a photodetector which measures the intensity thereof. The electrical output signals of the photodetectors are mixed by an electronic control device in such a way that the uncoded signal is retrieved.

BRIEF DESCRIPTION OF THE DRAWINGS

Other objects, features and advantages of the invention, its organization, construction and operation will best be understood from the following detailed description, taken in conjunction with the accompanying drawings, on which.

DESCRIPTION OF THE PREFERRED EMBODIMENTS

Figure 1:
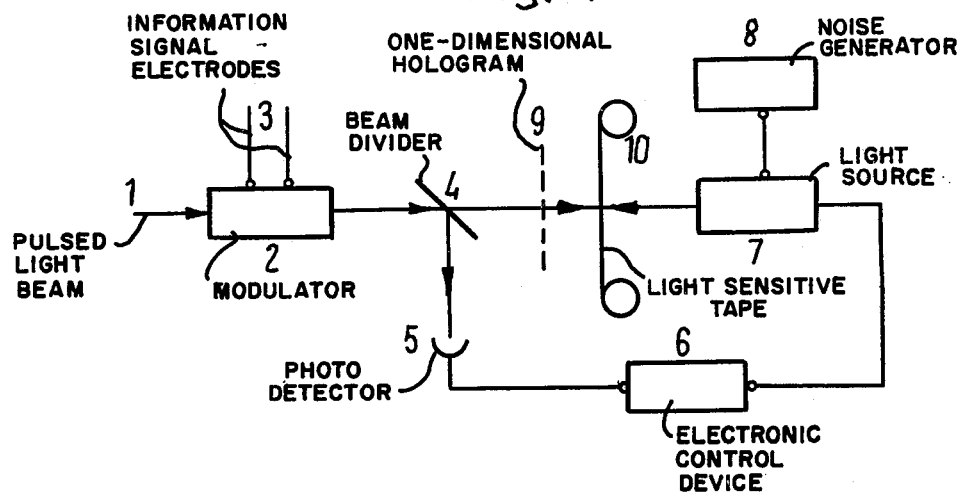
FIG. 1 is a schematic illustration of an arrangement for the coded storage of data.

In the schematic arrangement for carrying out the method according to this invention which has been illustrated in FIG. 1, a pulsed sensed light beam 1 strikes a modulator 2 in the direction of the arrow. The information which is to be stored is amplitude modulated upon the light beam by way of an information signal source (not shown) connected to a pair of electrodes 3 of the modulator 2. The pulse amplitude-modulated light beam then permeates a one-dimensional hologram 9 and impinges upon a light-sensitive tape 10. The hologram which is recorded upon a photo plate, can be transmitted either by way of a recording optic or by means of contact copying, onto the light-sensitive band.

A sensing pulse of high intensity will cause a high hologram contrast upon the storage band, while a sensing pulse of lower intensity causes a correspondingly lower hologram contrast, due to the effect of a correction exposure.

In order to carry out a correction exposure, a fraction of the pulse amplitude-modulated light beam is mirrored out by means of a beam divider 4 disposed between the modulator 2 and the hologram 9 in the beam path. The mirrored out fraction of the beam is supplied to a fast response photodetector 5 which measures the intensity of the partial beam. A subsequently connected electronic control device takes over the control of the correction exposure, corresponding to the signal measured at the detector 5 to operate a light source 7 to transmit a correction beam upon the light-sensitive tape 10. It is thereby essential that the correction exposure, with respect to the signal exposure, can be effected spatially and timely separate.

The correction exposure is therefore effected in such a way that the entire exposure composed of signal exposure and correction exposure remains constant during each recording interval. Therefore, movement of the operational point upon the characteristic of the light-sensitive band during the individual exposures due to strong intensity fluctuations of the pulse amplitude-modulated light beam is prevented.

The coding of the information which is to be recorded, according to the present invention, is now effected in such a way that the correction exposure is modulated with a time varying noise intensity signal. For this purpose, a noise generator 8 is provided and connected to the light source 7 and provides the light source 7 with the requisite noise signals. The contrast of the individual holograms recorded upon the light sensitive tape 10 is therefore statistically varied in such a way that a reconstruction of the coded stored information cannot be accomplished without knowledge of the noise signal.

The intensity spectrum of the noise signal must thereby be dimensioned in such a way that the linear range of the characteristic of the storage medium is not exceeded during the entire exposures resulting from the process.

Figure 2:
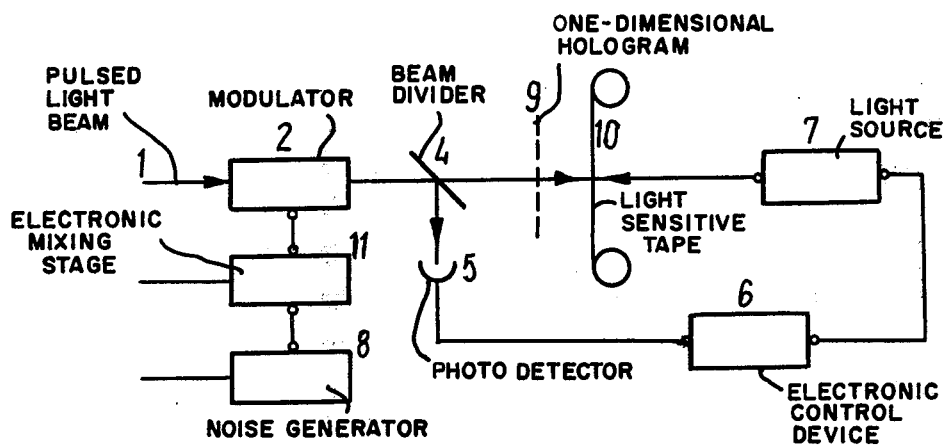
FIG. 2 is a schematic illustration of another arrangement for the coded storage of data.

Referring to the arrangement illustrated in FIG. 2, the same reference numerals have been applied for equal component elements which are found in FIG. 1. In the case of the apparatus illustrated in FIG. 2, however, it is not the correction exposure which is modulated by a noise signal, but the pulse amplitude-modulated light beam itself is modulated. The noise signal emitted by the noise generator 8 is, in this case, supplied to an electronic mixing stage 11 which modulates the signal which is to be stored with the noise signal and then applies the modulated signal to the modulator 2 for modulating the pulse amplitude-modulated beam 1. In this case, the contrast of the individual holograms recorded on the light sensitive tape is statistically varied.

It is also possible with the method according to this invention to encode previously recorded information subsequently by means of adding a noise signal to an exposure beam. If the light-sensitive tape is a photographic emulsion, the coding must be effected before the development process.

The reading of stored hologram images must generally be effected with the help of a source of constant intensity, which is herein implied. Since, however, the requirements of the coherence during the reconstruction and reproduction of holograms is much less than during the recording of the holograms, as it is known in the art, quasi-coherent light sources, such as gas discharge lamps, luminescent diodes or laser diodes will suffice, with the possibility of also utilizing spatially and/or spectrum filtering. Since the diffraction efficiency is directly proportional to the hologram contrast during the reconstruction, the stored information will be retrieved by way of an intensity-sensitive detector.

It is particularly favorable in the arrangements illustrated in FIGS. 1 and 2 to simultaneously store the noise signal upon a second (non-illustrated) light-sensitive storage tape, hereinafter referred to as a "noise tape". The noise signal employed for coding is therefore retrieved during the reading process by itself, by means of sensing the noise tape with a quasi-coherent light beam.

Figure 3:
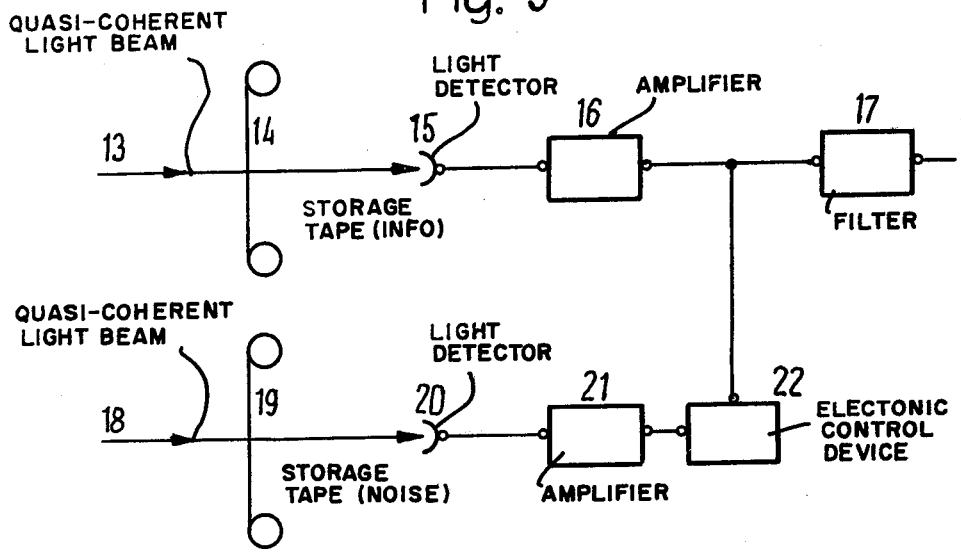
FIG. 3 is a schematic illustration of an arrangement for reading coded stored data.

An arrangement for reading the coded stored information has been illustrated in FIG. 3. A storage tape 14 containing the coded information is guided along a reconstruction light source (not illustrated) which emits a quasi-coherent light beam 13 in the direction of the arrow onto the storage tape 14. The intensity-modulated light beam causes an alternating current at a light detector 15 which is supplied to an amplifier 16. Simultaneously, the noise tape 19 containing only the stored noise signal is permeated by a quasi-coherent light beam 18, and an alternating current corresponding to the noise signal is produced at the detector 20 whose output signal is supplied to an amplifier 21 and from there to an electronic control device 22. The output signals of the amplifier 16 and of the electronic control device 22 are supplied to a filter 17 which filters out the noise signal so that the original decoded signal is available at the output of the filter 17.

Figure 4:
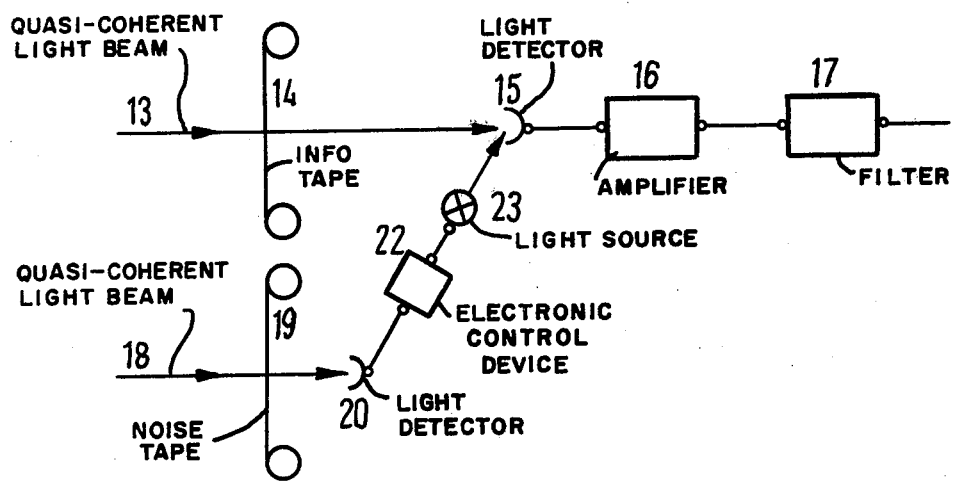
FIG. 4 is a schematic illustration of another arrangement for reading the coded stored data.

FIG. 4 illustrates an arrangement for reading coded stored information wherein the decoding is carried out on an optical basis. For this purpose, the storage tape 14 containing the coded information is permeated by a quasi-coherent light beam 13 which impinges upon a light detector 15, as in FIG. 3. Simultaneously, the noise tape 19 is permeated by a second light beam 18 and a corresponding alternating current is produced at the detector 20. The alternating current of the detector 20 is supplied to an electronic control device 22 which, in turn, controls a light source 23 in such a way that its correction exposure is directed directly upon the light detector 15 which also registers the intensity of the reconstructed coded hologram images. After amplification by means of the amplifier 16, the decoded stored information appears at the output of the filter 17. In order to guarantee synchronization of the signal tape and the noise tape during the reading process, a timing frequency of clock pulses is recorded upon both tapes. For this purpose, for example, a portion of the post non-modulated light beam can be employed during the recording process. A fraction of the pulsed light beam may be mirrored out before the modulation by means of a beam divider and guided to a photodetector. A subsequently connected, possibly electronic, counter passes an nth pulse which effects recording of a synchronization mark upon the two light sensitive tapes.

Since the level of the coding pulses is important during the decoding process in the arrangements of FIGS. 3 and 4, it is recommended to further store some calibration pulses upon the signal and noise tapes with the help of which levels of the coding pulses can be automatically or manually adjusted, if required.

Although I have described my invention by reference to a specific illustrative embodiment thereof, many changes and modifications of my invention may become apparent to those skilled in the art without departing from the spirit and scope of the invention. I therefore intend to include within the patent warranted hereon all such changes and modifications as may reasonably and properly be included within the scope of my contribution to the art.

I claim:

1. A method for coded, sequential, non-coherent, redundant, optical data storage, comprising the steps of: sequentially recording in a timed sequence a number of one-dimensional holograms upon a light-sensitive tape with a pulse amplitude-modulated light beam; applying a correction exposure of the light-sensitive tape with a correction beam separate from the signal exposure with respect to space and time to provide an entire exposure which is constant during each recording; and modulating one of the beams with a noise signal with respect to time to provide a contrast of the individual recorded holograms which statistically varies.

2. A method according to claim 1, wherein the step of modulating one of the beams is further defined as modulating with a noise signal having a spectrum which provides that the entire exposures are positioned within the linear range of the characteristic of the light-sensitive tape.

3. A method according to claim 1, comprising the step of simultaneously recording the noise signal upon a second light-sensitive tape for retrieval.

4. A method according to claim 3, comprising the step of recording synchronization marks at equal instance upon both of the light-sensitive tapes.

5. A method according to claim 3, comprising the steps of permeating both of the tapes with a reconstruction light beam; demodulating each light beam with respect to intensity; and mixing the demodulation products to retrieve the decoded information.

* * * * *